United States Patent [19]

Yamada et al.

[11] Patent Number: 4,942,430

[45] Date of Patent: Jul. 17, 1990

[54] IMAGE RECORDING APPARATUS HAVING SEPARATED OPTICAL AND DEVELOPING UNITS

[75] Inventors: Makoto Yamada, Gifu; Osamu Nagata, Aichi; Toshio Sugiura, Nagoya; Tsuyoshi Suzuki, Nagoya; Kazuhito Ishida, Nagoya; Eiji Shibata, Nagoya; Kazumasa Makino, Nagoya; Yoichi Horaguchi, Nagoya; Takashi Tomizawa, Aichi; Shigeyuki Hayashi, Nagoya; Motoshi Ohno, Nagoya; Takashi Nakata, Nagoya, all of Japan

[73] Assignee: Brother Kogyo Kabushiki Kaisha, Aichi, Japan

[21] Appl. No.: 281,327

[22] Filed: Dec. 8, 1988

[30] Foreign Application Priority Data

Dec. 11, 1987 [JP] Japan .............................. 62-189350[U]
Dec. 15, 1987 [JP] Japan .............................. 62-191005[U]
Dec. 15, 1987 [JP] Japan .............................. 62-191013[U]

[51] Int. Cl.$^5$ .............................................. G03G 15/04
[52] U.S. Cl. ........................................ 355/232; 355/66
[58] Field of Search ...................... 355/66, 64, 65, 210, 355/228, 229, 230, 231, 232

[56] References Cited

U.S. PATENT DOCUMENTS

| | | | |
|---|---|---|---|
| 4,077,710 | 3/1978 | Ward et al. | 355/66 X |
| 4,134,671 | 1/1979 | Leonard | 355/66 X |
| 4,264,199 | 4/1981 | Kuehnle | 355/66 |
| 4,394,084 | 7/1983 | Kuehnle | 355/66 X |
| 4,399,209 | 8/1983 | Sanders et al. | 430/211 X |

*Primary Examiner*—R. L. Moses
*Attorney, Agent, or Firm*—Oliff & Berridge

[57] ABSTRACT

An image recording apparatus for forming a latent image on a photosensitive pressure sensitive sheet and for developing the latent image on a developer sheet. The apparatus includes an exposure unit and a developing unit positioned close to each other. The apparatus also includes an optical system for irradiating light onto an original and directing the light reflected at the original toward the exposure zone. The original has an original image facing downwardly, and the photosensitive sheet has an imaging surface facing downwardly at the exposure zone. The optical system provides a U or J-shaped optical path extending from the original to the exposure zone. The optical system has reflection mirror unit vertically movably secured to a pair of frames of the apparatus. The frames are reinforced with a partition member which also functions as a light shielding member. The partition member divide an internal space defined by the frames into two chambers so as to accommodate therein the developing unit and the optical system, respectively.

10 Claims, 2 Drawing Sheets

IMAGE RECORDING APPARATUS HAVING SEPARATED OPTICAL AND DEVELOPING UNITS

BACKGROUND OF THE INVENTION

The present invention relates to an image recording apparatus such as a copying machine or a printer. Further, relating U.S. Patent applications have been filed bearing Ser. Nos. 281,336 (corresponding to Japanese Utility Model Application No. 62-189349) filed on Dec. 8, 1988, and Ser. No. 281,215 (corresponding to Japanese Utility Model Application Nos. 62-191014 and 63-17646) filed on Dec. 8, 1988.

A commonly assigned copending U.S. Patent application Ser. No. 244,681 has been filed on Sept. 14, 1988 which discloses an image recording apparatus having an exposure unit, an optical system, and a developing unit. This copying machine employs a transfer type image recording mediums such as a photosensitive sheet which comprises a microcapsule sheet (first image recording medium) and a developer sheet (second image recording medium). More specifically, in the transfer type recording mediums, the developer material is coated on a separate substrate as a separate developer or copy sheet. The first image recording medium comprises a photosensitive pressure sensitive recording medium provided with microcapsules which encapsulate therein a first material (chromogenic material or dye precursor) having first and second phases dependent on light exposure. The second image recording medium comprises the developer medium provided with second material (developer material) which provides an output image upon reaction with the first material. Such image recording medium is disclosed in, for example, U.S. Pat. No. 4,399,209 and Japanese Patent Application Kokai No. 58-88739.

The image recording apparatus disclosed in the copending U.S. Patent Application is shown in FIG. 1 which generally includes a main frame 140, an exposure unit E for exposing photosensitive pressure sensitive image recording medium 137 to light by means of an optical system L at an exposure zone 119 so as to form a latent image corresponding to an original (not shown) on the recording medium 137, a pressure developing unit 120 for pressure developing the recording medium 137 which carries the latent image, and sheet feeding means F including feed rollers 150 for feeding the recording medium 137 from the exposure unit to the pressure developing unit 120.

At an upper portion of the apparatus, an original cover member 101 and an original support glass 102 for mounting thereon an original (not shown) are disposed which are movable in horizontal direction indicated by arrows A and B. The optical system L is positioned below the original support glass 102. The optical system L includes a light source 103, a semi-cylindrical reflector 104, a plane reflector 105, a first reflection mirror 111a, a shutter 116, a lens unit 109, a filter 108, and a second reflection mirror 111b. The semi-cylindrical reflector 104 is positioned behind the light source 103 so as to direct light toward the original, and the plane reflector 105 is adapted to reflectingly direct the light toward the original from the light source which light originally has not been directly directed toward the original. The first reflection mirror 111a is adapted to direct light reflected from the original toward the shutter 116, the lens 109 and the filter 108, with providing a first optical axis having a light path length L1 between the first reflection mirror 111a and the shutter 116. The second reflection mirror 111b is adapted to direct light passing through the filter 108 toward the exposure zone 119. A second optical axis having a light path length L2 is defined between the filter 108 and the second reflection mirror 111b.

At a lower portion of the apparatus, a phOtosensitive sheet roll cartridge 113 is disposed whose upper surface serves as the exposure zone 119. The photosensitive pressure sensitive recording medium 137 accommodated within the cartridge 113 is pulled out of the cartridge 113, and is promptly subjected to light exposure at the upper surface of the cartridge 113. In this case, the photosensitive sheet 113 is continuously moved in synchronism with the horizontal movement of the original support glass 102 in the direction indicated by the arrow B, and therefore, a latent image corresponding to the original is successively formed on the photosensitive sheet 137.

The pressure developing unit 120 is disposed below the optical system L and beside the sheet roll cartridge 113 at downstream side thereof with respect to a sheet path. Further, a developer sheet cassette 132 is disposed below the developing unit 120 so as to supply each one of a developer sheet 138 at an inlet portion of the developing unit 120. At the inlet portion, the developer sheet 138 is superposed with the photosensitive sheet 137 which carries the latent image, and the thus superposed sheets 138 and 137 are subjected to pressure at the developing unit 120, so that developed image is provided on the developer sheet 138.

A take-up means 125 is disposed beside the optical system L so as to wind the light-exposed photosensitive sheet 137 thereover. Further, separation unit 123 is disposed at downstream of the developing unit 120 so as to separate the developer sheet !38 from the photosensitive sheet 137. Furthermore, a thermal fixing unit 142 is disposed at downstream side of the separation unit 142. The thus separated developer sheet carrying the developed image thereon is subjected to thermal fixing operation, so that a final visible image is provided on the developer sheet 138.

According to the image recording apparatus disclosed in the copending U.S. Patent Application, the following disadvantages may be conceivable:

When assembling the optical system L into the apparatus, securing positions of the first and second reflection mirrors 111a and 111b must be finely adjusted independent of each other so as to finally provide an optimum optical axes L1 and L2. Further, in order to adjust focussing length of the lens unit 109, relative positional relationship between the dense unit 109 and the reflection mirrors must be further adjusted. However, since the adjustment requires positional or angular orientational changes of the reflection mirrors 111a and/or 111b, exposure position at the exposure zone 119 may be deviated, and therefore, latent image may not be formed at a proper position on the photosensitive pressure sensitive sheet 137.

The optical axes L1 and L2 defined by the above described optical system L must be oriented in given directions with respect to the moving directions A and B of the original support units 101 and 102 so as to avoid degradation of image-resolution power. With the structure, the main frame 140 may be distorted, if a heavy original such as an encyclopedia is mounted on the original support glass 102 for a page copying, or if such heavy member is mounted on the upper portion of the main frame 140, or if inadvertent load or impacting force is applied externally to the main frame 140. However, as described above, since the optical system is disposed along the directions A and B at the upper portion of the apparatus, the optical system per se is also subjected to distortion due to the mechanical deformation of the main frame 140. As a result, the optical axes L1 and L2 may be deviated from their correct positions, to thereby disadvantageously provide defocusing, to thus cause degradation of the resolution power.

Further, as described the above, the developer sheet 138 carries the developer medium reactable with the chromogenic material of the microcapsule sheet 137. When the developer sheet 138 passes through the pressure developing unit 120 and the thermal fixing unit 142, part of the developer material may be released from the developer sheet due to frictional contact with these units, and the thus released developer material may be in the particulate forms. As is well known, the pressure developing unit 120, the thermal fixing unit 142 and other unit such as a driving unit (not shown) may release heat, and the light source 103 generates a radiant heat. Therefore, such heat may generate air convection, so that the particles of the developer materials may fly upwardly, and the particles may be accumulated on the components of the optical system L. As a result, resolution power may be degraded or lowered.

Furthermore, with the structure disclosed in the copending application, the photosensitive pressure sensitive sheet 137 is initially pulled over the upper surface of the sheet roll cartridge 113 for light exposure, and the thus exposed sheet 137 is then delivered to the pressure developing unit 120 through a sheet path provided by the feed rollers 150. Since the feed rollers 150 are each disposed alongside the sheet roll cartridge 113, excessive length of the photosensitive pressure sensitive sheet 137 is required so as to provide a single image thereon, which length greatly exceeds a length of a final output image. More specifically, in order to obtain an image, bridging over the exposure zone 119, other sheet lengths are required which extend along the side surfaces of the sheet cartridge 113 so as to allow the sheet 137 to reach the pressure developing unit 120. Accordingly, the sheet 137 is disadvantageously wasted.

SUMMARY OF THE INVENTION

It is therefore, an object of the present invention to overcome the above-described drawbacks attendant to the image recording apparatus disclosed in the copending U.S. Patent Application.

Another object of this invention is to provide an improved image recording apparatus in which reflection mirrors can be easily assembled into the apparatus with minimized adjustment work, yet obviating displacement or deviation of the exposure position on a photosensitive pressure sensitive recording medium at an exposure zone.

Still another object of this invention is to provide such improved image recording apparatus having sufficient rigidity withstanding external load applied to an upper portion of a main frame, to thereby avoid deviation of optical axis or path reaching the exposure zone.

Still another object of this invention is to provide such apparatus capable of preventing particles of developer materials released from a developer sheet from being accumulated on components of an optical system, to thereby maintain sufficient resolution power.

Still another object Of &his invention is to provide such apparatus capable of eliminating sheet loss or waste at a portion between the exposure unit and the developing unit, to thereby effectively utilize the photosensitive pressure sensitive sheet.

These and other objects will be attained in accordance with the present invention by providing an image recording apparatus for recording an image on an imaging surface of an image recording medium, the image corresponding to an original image; the apparatus comprising; an original support member on which the original image is mounted with its image surface facing down; an exposure unit having an exposure zone, the image recording medium passing along the exposure zone with the imaging surface facing down; an optical system provided at a position between the original support member and the exposure zone, the optical system being provided with a single reflection unit and providing a first optical path directing vertically downwardly from the original support member, a second optical path directing horizontally, and a third optical path directing vertically upwardly, the second optical path being provided by the single reflection unit.

With the construction, the reflection unit provides a generally U or J shaped Optical path extending from said original support member to said exposure zone so as to convert the optical direction exactly reversely. The reflection unit is vertically movable in a direction parallel with the first vertical optical path. Therefore, even if vertical position of the reflection unit is changed, image focussing position with respect to the exposure zone can be mantained unchaged, even thought resultant optical length is increase by twice as large as the moving distance of the reflection unit.

According to another aspect of this invention, there is provided an image recording apparatus for recording an image on an image recording medium, the image corresponding to an original; the apparatus comprising; a pair of main frames defining an internal space therebetween; an exposure unit disposed within the internal space, the exposure unit defining an exposure zone for forming a latent image on the image recording medium; an optical system secured to the main frames for irradiating light toward the original and directing light reflected from the original toward the exposure zone, the optical system providing an optical path extending from the original to the exposure zone; a developing unit disposed downstream of the exposure unit and provided with a developing zone for pressure developing the latent image; and, a partition member connecting between the pair of main frames for dividing the internal space into a first and second chambers, the developing unit being disposed within the first chamber and the optical system being disposed within the second chamber.

With the structure, the partition member will reinforce the main frames, so that resultant frame has a mechanical strength or rigidity capable of withstanding external load applied thereto. Accordingly, the optical system secured to the frames can still maintain relative positional relationships, to thereby maintain original optical path without its deviation. Further, the partitioning member completely separate the first chamber from the second chamber. Therefore, even if developer material is released from a developer sheet of the image recording medium, the developer material particles do not enter the second chamber. As a result, the optical system is protectable against the contamination with the particle.

According to still another aspect of the invention, there is provided an image recording apparatus for recording an image on an image recording medium, the image corresponding to an original image directing downwardly; the apparatus comprising; a pair of main frames defining an internal space therebetween; an exposure unit disposed within the internal space and defining an exposure zone along which the image recording medium is travelled, the image recording medium being provided with an imaging surface facing downwardly at said exposure zone for forming a latent image on the imaging surface; an optical system secured to the main frames for irradiating light toward the original image and directing light reflected from the origianl image toward the exposure zone, the optical system providing an optical path extending from the original to the exposure zone; and, a developing unit disposed downstream of the exposure unit and provided with a developing zone for pressure developing the latent image, the exposure zone and the developing zone being positioned close to each other.

With this construction, the image recording medium undergoing the light exposure at the exposure zone is then travelled toward the developing zone. In this case, since the developing zone is positioned close to the exposure zone, a marginal section of the recording medium can has a minimized length, which marginal section is defined between the leading section at the developing zone and a following section at the exposure zone.

DETAILED DESCRIPTION OF THE PREFERRED EMBODIMENTS

Figure 1:
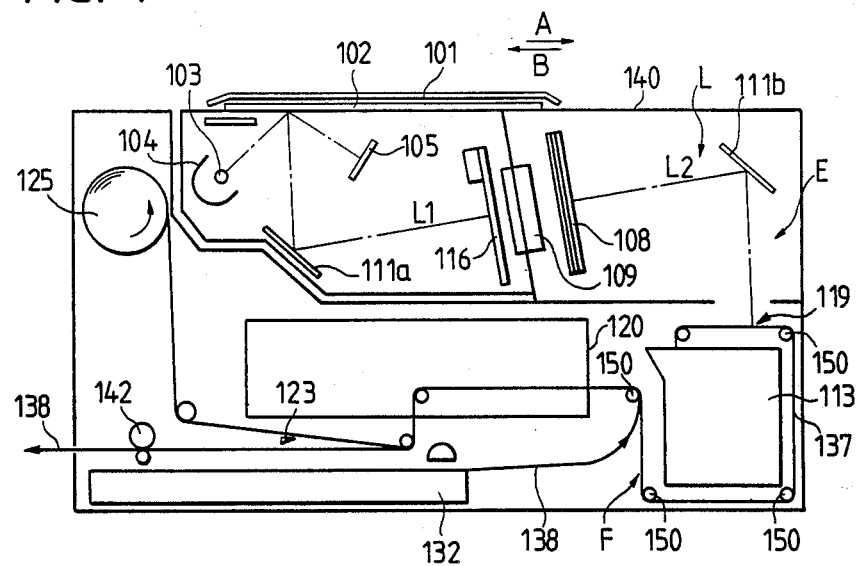
FIG. 1 is a schematic elevation showing an image recording apparatus according to a copending U.S. Patent Application Ser. No. 244,681.

A first embodiment of this invention will be described below with reference to FIGS. 1 thru 3.

Figure 2:
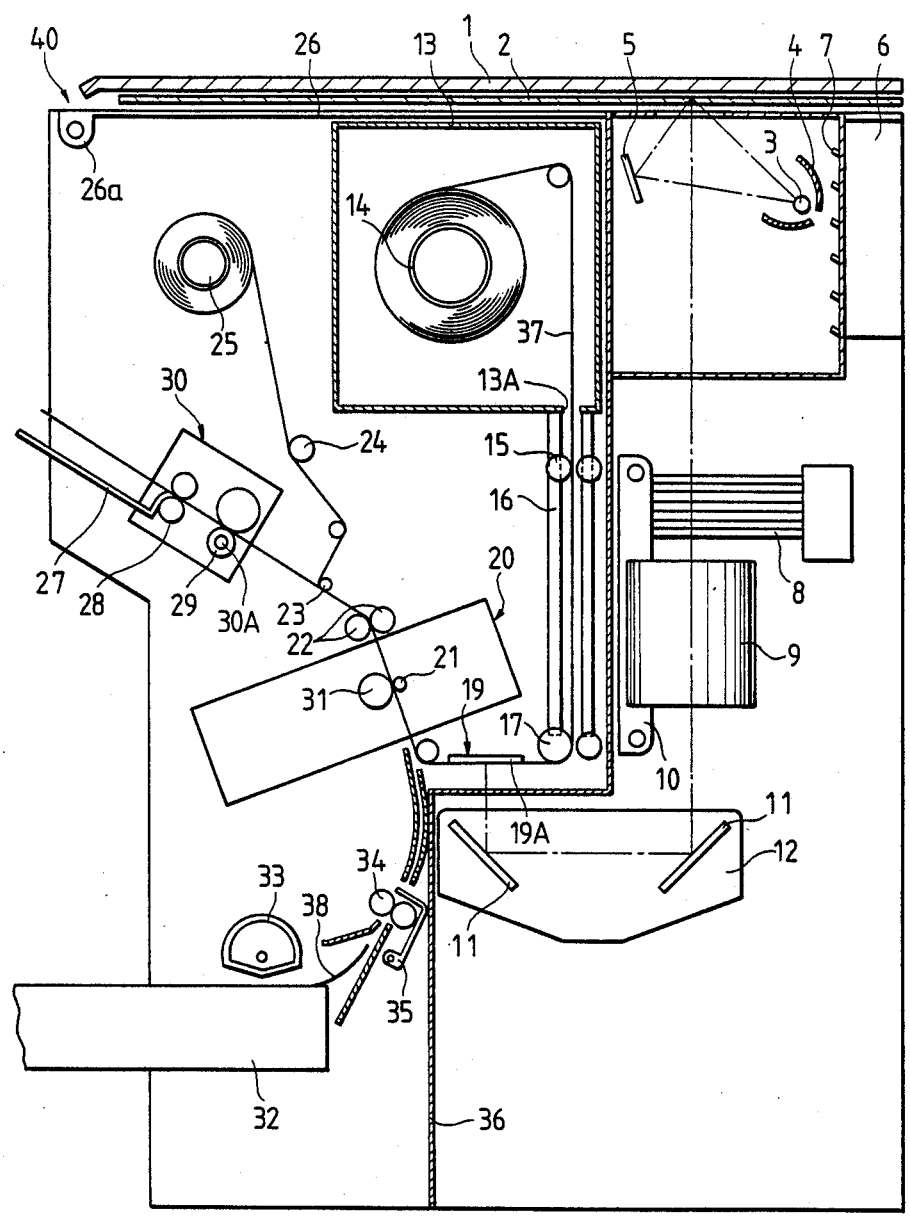
FIG. 2 is a schematic elevational view showing an image recording apparatus according to the present invention; and, FIG. 3 is a fragmentary perspective view showing a main frame and a partition member according to the present invention.

FIG. 2 shows a copying machine capable of performing a full-color copying. This copying machine employs the transfer type image recording mediums as described in U.S. Pat. No. 4,399,209 and Japanese Patent Application Kokai No. 58-88739.

As shown in FIG. 2, the copying machine 40 generally includes an exposure unit 19 having an exposure stand 19A and a pressure developing unit 20. An exposure zone of the exposure unit 19 is positioned quite adjacent to a developing zone of the pressure developing unit 20 as shown. This closely adjacent positional relationship is advantageous in that a length of a non treated or margin section of an elongated web-like microcapsule sheet 37, the margin being positioned between a leading pressure developing section of the sheet 37 and the following exposure section thereof, can be minimized, so that the sheet 37 is efficiently used. Such closely adjacent arrangement between the exposure zone and the developing zone will render the entire apparatus 40 compact.

Figure 3:
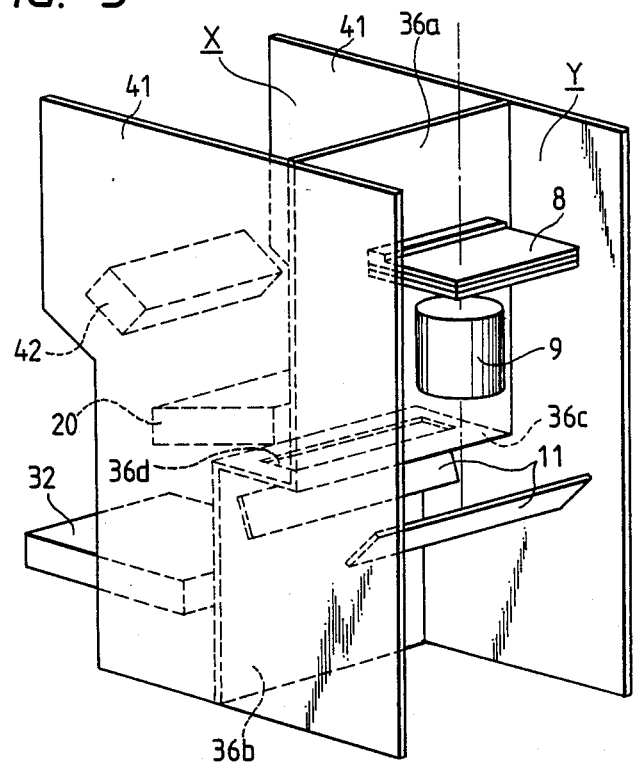

Further, a light shielding partition plate 36 is disposed in the apparatus to spacedly divide the apparatus into two chambers X and Y as best shown in FIG. 3. That is, an optical system briding from the light source to the exposure unit is disposed within the chamber Y whereas other requisite units such as the pressure developing and thermal fixing units are disposed within the chamber X. As best shown in FIG. 3, the recording apparatus 40 includes a pair of main frames 41 and 41 to provide an internal space therebetween. Within the space, the above described unit such as exposure unit and the pressure developing unit etc. are disposed. The light shielding cover plate 36 extends between the pair of frames 41 and 41, and between upper and lower ends of each of the frames. More specifically, in the light shielding partition plate 36 there are two vertically extending sections 36a, 36b and an intermediate horizontal section 36c at which a window 36d is formed to allow light to pass therethrough, so that the microcapsule sheet 37 undergoes exposure to light.

The elongated web-like microcapsule sheet 37 is wound around a cartridge shaft 14, and is retained in a microcapsule sheet cartridge 13 that is detachably disposed at a position immediately below an original support stand glass 2 and is formed with bottom opening 13A. The exposure unit 19 is disposed below the sheet cartridge 13 at a downstream side thereof. The sheet 37 passes through a number of rollers and the pressure developing unit 20, and a leading end of the sheet 37 is attached to a take-up shaft 25 positioned beside the sheet cartridge 13. The light shielding partitioning plate 36 also serves to reinforce the confronting frames 41,41. Therefore, even if a heavy original such as a heavy encyclopedia is mounted on the original support stand glass 2 for a page copying, distortion of the main frames 41 can be avoided. Accordingly, light path deviation can also be obviated.

Between the sheet cartridge 13 and the exposure unit 19, feed roller 15 and a barrel roller 17 are rotatably provided at a vertical sheet path for guide travel of the sheet toward the exposure unit. At the downstream side of the exposure unit 19, there is provided the pressure developing unit 20 which includes a small diameter roller 21 and a backup roller 31.

At a lower portion of the apparatus 40, there is provided a developer sheet cassette 32 for storing therein a stack of developer sheets 38. Immediately above the cassette 32, a sector roller 33 is provided to feed each one of developer sheet 38 toward the pressure developing unit 20. Between the cassette 32 and the pressure developing unit 20, a roller 34 and resist-gate 35 are provided so as to align leading edge of the developer sheet 38.

At downstream side of the pressure developing unit 20, a pair of feed rollers 22 are provided so as to provide constant running speed of the microcapsule sheet 37. This speed is coincident with a horizontally moving speed of the original support stand glass 2. At downstream side of the the microcapsule sheet 37 is separated from the developer sheet 38. The separate microcapsule sheet 37 is taken-up by the above mentioned take up means 25 through a meander travel control roller 24. On the other hand, thermal fixing unit 30 is provided at the downstream side of the separation roller 23. The thermal fixing unit 30 includes a hollow heat roller 29 in which a heater element 30 is disposed Further, a developer sheet feed roller 28 is provided to feed the image fixed developer sheet 3B toward a discharge tray 27.

Next, an optical system and optical path in the copying machine 40 will be described. As shown in FIG. 2, the copying machine 40 has its top plate portion provided with a stand cover 1 and the original support stand glass 2. The original support stand glass is formed of light transmissive material and is movable in the horizontal direction and on which a desired original (not shown) is to be placed. At the upper one side section (right side in FIG. 2) of the copying machine 40, fixedly provided is a light source including a linear halogen lamp 3 extending in the direction perpendicular to the moving direction of the original support stand glass 2, and a semi-cylindrical reflector 4 disposed to surround the lamp 3. The light source emits a linear-line light ray to the original support stand glass 2.

Therefore, the light emitted from the halogen lamp 3 can be sequentially irradiated on the entire surface over the region from the one to another ends of the original support stand glass 2 in accordance with the horizontal movement of the glass 2. The light from the light source passes through the transparent original support stand glass 2 and is reflected at the original mounted thereon. The original support stand cover 1 which covers the top surface of the glass 2 is provided in order to prevent this light from leakage out of the apparatus.

To irradiate the light from the halogen lamp 3 on the original at a high efficiency, a flat reflector 5 is disposed on one side of the light source. The flat reflector 5 is adapted to reflectingly direct lights which do not directly impinge the original from the light source and concentrate such reflected light onto the original.

At another side of the halogen lamp 3 there are provided a fan 6 and a louver 7 for introducing an external air into the apparatus. Accordingly, air is effectively impinged onto the light source to cool the same.

A filter 8 is disposed below the original support stand glass 2. Further, a lens unit 9 is provided below the filter 8. Light emitted from the halogen lamp 3 and reflected at the original placed on the original support stand glass 2 passes through the filter 8 and enters the lens 9. The filter 8 alters the light transmissive characteristic in accordance with the sensitivity characteristics of a microcapsule sheet 37, to thereby adjust the color tone of a copied output image. The lens 9 is fixedly secured to a lens mounting plate 10, and fine angular adjustment of this lens with respect to a light path is achievable.

A pair of reflection mirrors 11 and 11 are provided below the lens 9. The condensed lights passing through the lens 9 change their direction by 180 degrees (completely reverse direction) by the two reflection mirrors 11, and the thus oriented lights impinge on the microcapsule sheet 37 closely contacting the bottom of the exposure table 19A to form the latent image thereon. The two reflection mirrors 11 are securely mounted to a mirror mounting plate 12. The mirror mounting plate 12 is vertically movably connected to the main frame 41 of the apparatus 40, so that the adjustment of the length of the light path and focusing adjustment can be effected by fine adjustment of the position of the mirror mounting plate 12. The original (not shown), the filter 8, the lens 9, the pair of reflection mirrors 11 and the exposure table 19 define a U-shape or J-shape light path in combination. That is, the optical path is bent into U-shape or J-shape so as to have a first vertical path directing downwardly, a second path directing horizontally and a third path directing upwardly. At the first optical path, a light reflected from the original is oriented downwardly, and at the third path the reflected light is directed toward the imaging surface of the photosensitive pressure sensitive recording medium at the exposure zone 19A, and the reflection mirror unit is disposed at the second optical path extending in horizontal direction. As a result, the mirror mounting plate 12 is adjustably movable in a direction parallel with the light path passing through the lens 9. Further, when the mirror mounting plate 12 is vertically moved by a certain length, the total light path length is increased by a length twice as large as the certain length, yet focusing position at the exposure zone is maintained unchanged, since these mirrors can be moved in a direction parallel with the optical axis.

The mirror mounting plate 12 can maintain relative angular positional relationship between the pair of mirrors 11 and 11 regardless of the vertical movement of the plate 12. Accordingly, the mirror mounting plate 12 which fixedly mounts the two mirrors serves as a single integral unit can be simply assembled to the recording apparatus 40 during assembly as the single integral unit. A pair of mirror mounting plates 12 are provided so as to secure side edges of the mirrors 11. The confronting mirror mounting plates 11 extend in vertical direction and are positioned so as not to block the light path. Furthermore, it should be noted that only the pair of reflection mirrors 11 are required so as to obtain a normal upstanding or erect imaging direction at the exposure zone, since the light is finally applied to the exposure zone upwardly, i.e, the microcapsule sheet is subjected to light irradiation at the exposure zone with the microcapsule surface facing down.

The above described optical components in the optical system are each secured to the front and rear main frames 41 and 41. Here, the above described vertically partitioning plate member 36 also serves to reinforce the front and rear main frames 41. That is, if a heavy original such as encyclopedia is placed on the original support glass 2 for a page copying, or if large external load is inadvertently applied to the upper portion of the frames 41, the partitioning plate member 36 can prevent the frames 41 from being deformed or distorted. Therefore, optical components of the optical system secured to the frames can still maintain original geometircal positions with one another, and as a result, the light path is not deviated from its original position even against the load application to the frames 41. Further, as shown in FIG. 3, since the partitioning plate or the light shielding plate 36 extends in a direction perpendicular to the front and rear main frames 41, the resultant apparatus can also withstand an external load applied in lateral direction.

Further, as shown in FIG. 3, the light shielding plate 36 fluid-tightly divides the internal space defined by the front and rear frames 41 into the chamber X where developing and fixing units are disposed and the other chamber Y where the optical components are installed. Therefore, even if developer material particles are released from the developer sheet 38 and the particles flow upwardly by a heat convention provided by the heat generated from, for example, the developing and fixing unit and the radiant heat from the light source, the thus circulating particles are not accumulated onto the optical components. Accordingly, the optical components are not contaminated with such particles, to thereby maintain original resolution power given by the optical system.

Operation of the copying apparatus will be described:

The microcapsule sheet 37 taken out through the opening 13A of the cartridge 13 is fed by the feed rollers 15 and guided by the barrel roller 17. The sheet 37 then passes in contact with a lower face of the exposure table 19A where original image carrying light is applied to the sheet 37, so that a latent image is formed on the sheet 37.

More specifically, the original support stand cover 1 is lifted up for mounting the original on the original support stand glass 2. Then, when a start button not shown) is depressed, the original support stand glass 2 is moved to one direction (rightwardly in FIG. 2), so that one side edge of the glass 2 (left side edge in FIG. 2) stops at a first position where the one side edge of the glass 2 is comming into confrontation with the light source Thereafter, with the halogen lamp 3 being lighted, the original support stand glass 2 is then moved in a second direction (leftwardly in FIG. 2) opposite to the first direction. The light emitted from the halogen lamp 3 is reflected at the original, and the reflected light passes through the filter 8 and lens 9 and is reflected at two reflection mirrors 11. The last reflected light is finally directed toward the microcapsule sheet 37 which is located under the exposure table 19 to form the latent image on the sheet 37. At this time, since the microcapsule sheet 37 is moved under the exposure table 19 in the second direction (leftwardly in FIG. 2) at the same speed as the moving speed of the original support stand glass 2, the latent image corresponding to the original image is formed on the microcapsule sheet 37. Since the conveying speed for the microcapsule sheet 37 is controlled to be constant by feed rollers 22 and is set equal to the moving speed of the original support stand glass 2, line latent images having given widths are sequentially formed on the microcapsule sheet 37 that is passing along the lower surface of the exposure table 19A.

The sheet is then fed to the pressure developing unit 20 by the guide roller 17. At the pressure developing unit, the sheet 37 is pressurizingly superposed with the developer sheet 38. An unexposed portion of the microcapsule sheet 37 leaving the cartirdge 13 is kept unexposed to light by the shielding cover 36. The developer sheets 38 are fed out one by one by the sector or woodruff roller 33, and each sheet 38 is fed to a sheet inlet of the pressure developing unit 20 after leading edge of the sheet 38 is aligned by developer sheet rollers 34 and the resist gate 35.

Accordingly, the microcapsule sheet 37 and the developer sheet 38 are fed, in close contact therewith, to the pressure developing unit 20. The microcapsule-carrying surface of the microcapsule sheet 37 on which a latent image is formed contacts the developer-coated surface of the developer sheet 38 at a position inside the pressure developing unit 20, and these superposed sheets are pressed together by the small roller 21 and the backup roller 31. Unexposed microcapsules are ruptured by the applied pressure, to thereby form an output image on the developer sheet 38 because of the reaction of chromogenic material with the developer material.

In summary, in timed relation with the movement of the original support stand glass 2 in the second direction, the woodruff roller 33 feeds out the developer sheets 38 one by one from the developer sheet cassette 32. The developer sheet 37 superposed on the light-exposed microcapsule sheet 37 is fed to the pressure developing unit 20, and the latent image on the microcapsule sheet 37 is developed and transferred onto the developer sheet 38.

The microcapsule sheet 37 and developer sheet 38 leaving the pressure developing unit 20 are fed out by the feed rollers 22 and are separated by the separation roller 23, the former sheet 37 directing upward and the latter sheet 38 directing in the straight direction.

Thereafter, the developer sheet 38 is subjected to thermal fixing in the thermal fixing unit 30 and is then discharged onto the discharge tray 27 with its image surface up. Meanwhile, the microcapsule sheet 37 leaving the pressure developing unit 20 and passing through the separation roller 23 and the meandering control roller 24 is wound around the take-up shaft 25. When the movement of the original support stand glass 2 is stopped at a second position where another edge (right side in FIG. 2) of the glass 2 confronts the the light source, the copying of the original is completed and the halogen lamp 3 is turned off.

In view of the foregoing, according the present invention, the following advantages are obtainable:

(a) Since the two reflection mirrors are securely held by the single mirror supporting member 12 as a mirror unit, it is unnecessary to further perform relative positional control between the reflection mirrors, and the vertical positions of the mirrors in accordance with the variation of focussing length of the lens unit can be easily performed by merely moving the supporting member 12 in vertical direction. Further, the mirrors can be easily assembled into and disassemble from the apparatus because of the unitary mirror structure.

(b) The mirror unit is movable in the direction parallel with the optical axis passing through the lens unit 9. Therefore, focussing position at the exposure zone can be maintained unchanged regardless of the vertical movement of the mirrOr unit.

(c) Since the exposure portion is directed downwardly because of J or U shape optical path, minimum numbers of the reflection mirrors, i.e., only two reflection mirrors are required for Obtaining a normal erect image, to thereby reduce production cost and simplify overall structure.

(d) Since the light shielding plate 36 is provided between the front and rear main frames 41, sufficient rigidity of the frames is obtainable which can sustain any load applied thereto in both vertical and lateral directions. Accordingly, no deviation of optical path is provided which optical path is defined by optical components secured to the frames.

(e) Since the light shielding plate 36 can fluid-tightly devide the internal space of the frames into two chambers in which one chamber accommodates therein image forming means such as developing and fixing units, and another chamber accommodates therein the optical system, the developer material particle can not enter the other chamber, so that the optical components are not contaminated with such particles, to thus maintain original resulution power, and facilitate maintenance thereto.

(f) Since the exposure zone and the developing zone are positioned close to each other, a length of the photosensitive sheet margin section defined between the leading developing zone and following exposure zone can be minimized. Accordingly, the photosensitive sheet 37 is efficiently utilized, to thereby enhance running cost of the sheet and provide compact apparatus. Further, the exposure operation and the developing operation can be made simultaneously, since the running speed of the photosensitive sheet 37 is set equal to the horizontally moving speed of the original support glass 2 which mounts thereon the original even under the efficient utiliziation of the photosensitive sheet 37.

The foregoing embodiment concerns the image recording apparatus using the photosensitive pressure sensitive recording medium. However, the present invention is also avaiable for other type of photosensitive copying system which employs toners.

While the invention has been described with reference to specific embodiment thereof, it would be apparent for those skilled in the art that various changes and modifications can be made therein without departing from the spirit and scope of the invention.

What is claimed is:

1. An image recording apparatus for recording an image on an image, recording medium, said image corresponding to an original being directed downwardly; said apparatus comprising:
    a pair of main frames defining an internal space therebetween;
    an exposure unit disposed within said internal space and defining an exposure zone along which said image recording medium is moved, said image recording medium being provided with an imaging surface facing downwardly at said exposure zone for forming a latent image on said imaging surface;
    said image recording medium comprising a first image recording medium and a second image recording medium, said first image recording medium comprising a photosensitive pressure sensitive recording medium provided with microcapsules, said microcapsules encapsulating therein a first material having a first and second phases dependent on light exposure, and having a first and second image recording medium comprising a developer medium provided with a second material which provides an output image upon reaction with said first material;
    an optical system secured to said main frames for irradiating light toward said original and directing light reflected from said original toward said exposure zone; said optical system providing an optical path extending from said original to said exposure zone, said optical path being bent into U-shape so as to have a first vertical path directed downwardly, a second path directed horizontally and a third path directed upwardly, at said first path, the light reflected from said original being oriented downwardly, and at said third path said reflected light is directed upwardly toward said imaging surface of said photosensitive pressure sensitive recording medium, said optical system comprising a reflection mirror unit for providing said second optical path, said reflection mirror unit being vertically movably secured to said pair of main frames, a mirror supporting member vertically movably secured to said main frames; and a pair of reflection mirrors confronting with each other and fixedly secured to said mirror supporting member.

2. The image recording apparatus as defined in claim 1 further comprising a partition member extending between said pair of main frames, said internal space being divided into first and second chambers by said partition member, said first chamber accommodating therein said developing unit and said second chamber accommodating therein said optical system.

3. The image recording apparatus as defined in claim 2 wherein said partition member is disposed to fluid-tightly provide said first and second chambers.

4. The image recording apparatus as defined in claim 3 wherein said partition member extends in a direction perpendicular to said pair of main frames.

5. An image recording apparatus for recording an image on an imaging surface of an image recording medium, said image corresponding to an image of an original said apparatus comprising:
    an original support member on which said original is mounted with its surface to be imaged facing downwardly;
    an exposure unit having an exposure zone, said image recording medium passing along said exposure zone with said imaging surface facing down;
    an optical system provided at a position between said original support member and said exposure zone; said optical system being provided with a single reflection unit and providing a first optical path directed vertically downwardly from said original support member, a second optical path directed horizontally, and a third optical path directed vertically upwardly, said second optical path being provided by said single reflection unit; and
    a pair of frames for accommodating therein said exposure unit and said optical system, and wherein said reflection unit is vertically movably secured to said pair of frames.

6. The image recording apparatus as defined in claim 5 further comprising a pair of frames for accommodating therein said exposure unit and said optical system, and wherein said reflection unit is vertically movably secured to said pair of main frames.

7. The image recording apparatus as defined in claim 5 wherein said reflection unit comprises a mirror supporting member vertically movably secured to said main frames; and a pair of reflection mirrors confronting with each other and fixedly secured to said mirror supporting member.

8. An image recording apparatus for recording an image on an image recording medium, said image corresponding to an original; said apparatus comprising;
    a pair of main frames defining an internal space therebetween;
    an exposure unit disposed within said internal space, said exposure unit defining an exposure zone for forming a latent image on said image recording medium;
    an optical system secured to said main frames for irradiating light toward said original and directing light reflected from said original toward said exposure zone; said optical system providing an optical path extending from said original to said exposure zone:
    a developing unit disposed downstream of said exposure unit and provided with a developing zone for pressure developing said latent image; and,
    a partitiOn member connecting between said pair of main frames for dividing said internal space into a first and second chambers, said developing unit being disposed within said first chamber and said optical system being disposed within said second chamber.

9. The image recording apparatus as defined in claim 8 wherein said partition member is disposed to fluid-tightly provide said first and second chambers.

10. The image recording apparatus as defined in claim 9 wherein said partition member extends in a direction perpendicular to said pair of main frames.

* * * * *